US006262484B1

United States Patent
Rangarajan et al.

(10) Patent No.: US 6,262,484 B1
(45) Date of Patent: Jul. 17, 2001

(54) DUAL DAMASCENE METHOD FOR BACKENED METALLIZATION USING POLY STOP LAYERS

(75) Inventors: Bharath Rangarajan, Santa Clara; Ramkumar Subramanian, San Jose; Bhanwar Singh, Morgan Hill, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/295,812

(22) Filed: Apr. 20, 1999

(51) Int. Cl.[7] .................. H01L 23/485; H01L 23/52; H01L 23/532
(52) U.S. Cl. .................. 257/752; 257/754; 257/762; 257/764; 257/774
(58) Field of Search .................. 257/635, 640, 257/649, 752, 754, 756, 762, 764, 774

(56) References Cited

U.S. PATENT DOCUMENTS

| 5,598,027 | * | 1/1997 | Matsuura | 257/635 |
| 5,612,254 | | 3/1997 | Mu et al. | 438/634 |
| 5,693,563 | | 12/1997 | Teong | 438/627 |
| 5,736,457 | | 4/1998 | Zhao | 438/624 |
| 5,739,579 | * | 4/1998 | Chiang et al. | 257/635 |
| 5,741,626 | * | 4/1998 | Jain et al. | 430/314 |
| 5,989,784 | * | 11/1999 | Lee et al. | 430/316 |
| 6,093,632 | * | 7/2000 | Lin | 438/618 |

FOREIGN PATENT DOCUMENTS 11-288935 * 10/1999 (JP) .

* cited by examiner

*Primary Examiner*—Eddie C. Lee
*Assistant Examiner*—Allan R. Wilson
(74) *Attorney, Agent, or Firm*—Skjerven Morrill MacPherson LLP; Edward C. Kwok, Esq.

(57) ABSTRACT

A dual damascene process and structure for fabricating semiconductor devices are disclosed. In one embodiment of the invention, a protection layer is deposited on top of a metal layer to protect the metal layer during subsequent etching of an oxide layer to form the via and damascene trench. Because the selectivity between the oxide layer and the protection layer is high, the number and complexity of processing steps are thereby reduced. Other embodiments of the present invention use a metal sealant layer and/or anti-reflective coating in conjunction with the protection layer in a dual-damascene process.

6 Claims, 6 Drawing Sheets

DUAL DAMASCENE METHOD FOR BACKENED METALLIZATION USING POLY STOP LAYERS

BACKGROUND OF THE INVENTION

1. Field of the Invention

The present invention relates to semiconductor device fabrication involving dual damascene processes and structures.

2. Description of the Related Art

In semiconductor device fabrication, damascene refers to interconnect lines provided in trenches of a dielectric layer. A damascene structure in the prior art is shown in FIG. 1. Damascene structure 5 includes trench 4 which is formed in dielectric layer 2 using conventional patterning and etching techniques. A hole or via 3 is formed through dielectric layer 2 to connect trench 4 and the underlying metallization layer 1. In a damascene process, via 3 and trench 4 are filled with conductive material thereby making an electrical connection between trench 4 and metal layer 1. Excess conductive material is subsequently removed using chemical mechanical planarization (CMP) or a planarization etch back step. A damascene process wherein the trench and vias are formed before filling the resultant structure with conductive material is referred to as a dual-damascene process.

Another dual-damascene process in the prior art is now described. As shown in FIG. 2, silicon nitride (SiN) layer 7 is deposited on top of copper layer 6 to seal copper layer 6. Dielectric layer 8 is then deposited on top of SiN layer 7. Using conventional patterning techniques, resist 9 is formed over dielectric layer 8 to define a hole or via 10. Resist 9 is also referred to as a via mask.

FIG. 3 depicts the structure of FIG. 2 after via 10 is formed by etching dielectric layer 8 and removing resist 9.

As shown in FIG. 4, via 10 is filled with spin-on organic bottom anti-reflective layer (BARC) 11 to prevent etching of SiN layer 7 through via 10 during formation of the damascene trench in later fabrication steps. Resist 12, also referred to as a damascene trench mask, is patterned over BARC 11 to define the damascene trench.

FIG. 5 depicts the structure of FIG. 4 after BARC 11 is etched. FIG. 6 shows the structure of FIG. 5 after trench 13 is formed by etching dielectric layer 8.

After resist 12 and BARC 11 are removed, a portion of SiN layer 7 defined by via 10 is then etched to provide a connection between trench 13 and copper layer 6 resulting in the damascene structure shown in FIG. 7.

In the above-described process, it is difficult to fill via 10 with a void-free BARC. When voids are present in the BARC, as shown in FIG. 8, the etchant used on dielectric layer 8 to form trench 13 can etch through BARC 11, SiN layer 7, and copper layer 6 thereby rendering the semiconductor device defective.

From the foregoing, there is a clear need for a dual-damascene process that does not require a BARC fill. Further, there is a need for a dual-damascene process that requires a minimum of processing steps thereby improving manufacturing efficiency, manufacturing yield, and device reliability.

SUMMARY OF THE INVENTION

The present invention is a dual-damascene process and corresponding structures for fabricating semiconductor devices. In one embodiment of the invention, a protection layer is deposited on top of a metal layer to protect the metal layer during subsequent etching of an oxide layer to form the via and damascene trench. Because the selectivity between the oxide layer and the protection layer is high, the number and complexity of processing steps are thereby reduced. Other embodiments of the present invention use a metal sealant layer and/or anti-reflective coating in conjunction with the protection layer in a dual-damascene process.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

A dual-damascene process is disclosed in commonly-owned pending U.S. patent application Ser. No. 09/225215, which is incorporated herein by reference.

Figure 1:
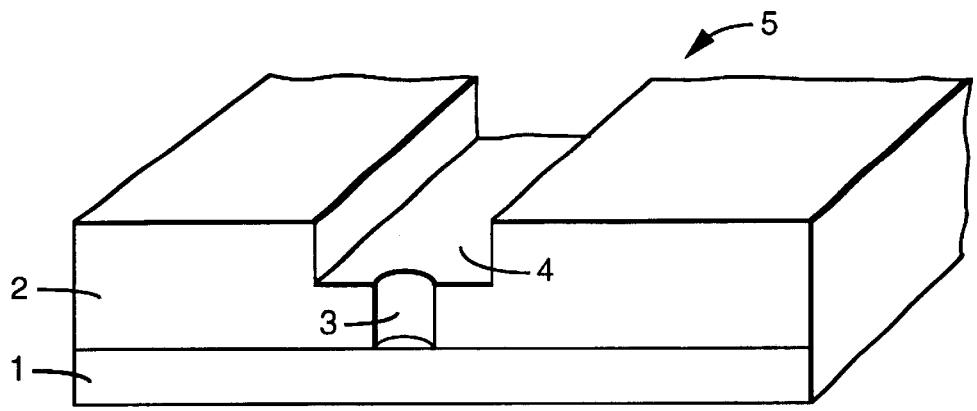
FIG. 1 shows a damascene structure in the prior art.
Figure 2:
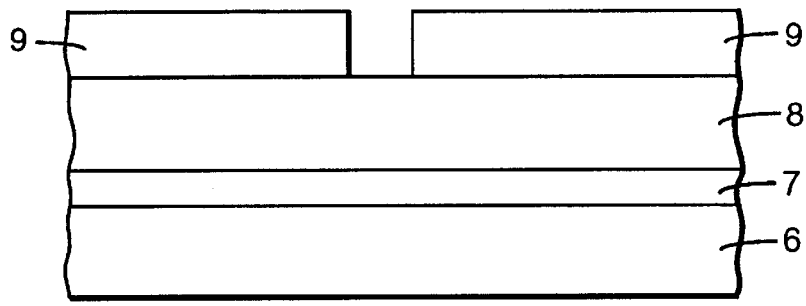
FIGS. 2–7 show cross-sections of a semiconductor structure in various stages of fabrication using a dual damascene process in the prior art.
Figure 3:
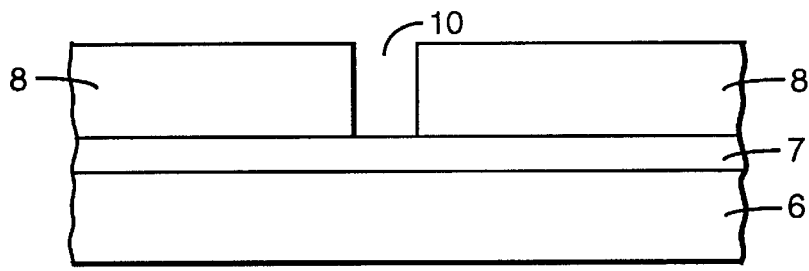
Figure 4:
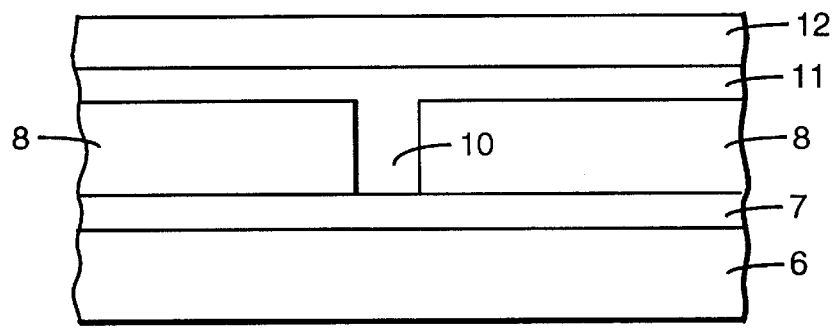
Figure 5:
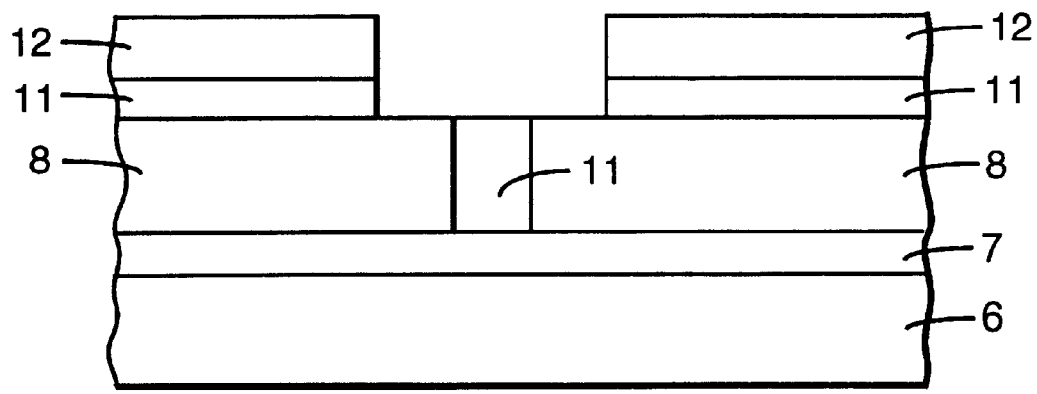
Figure 6:
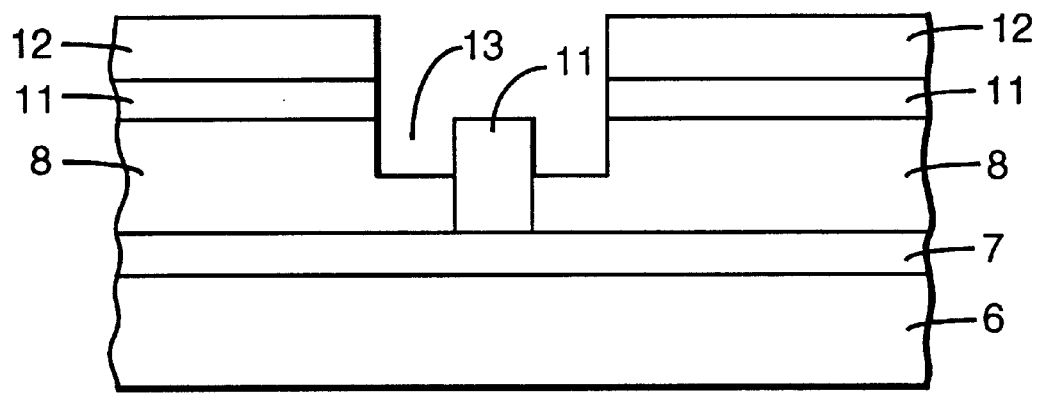
Figure 7:
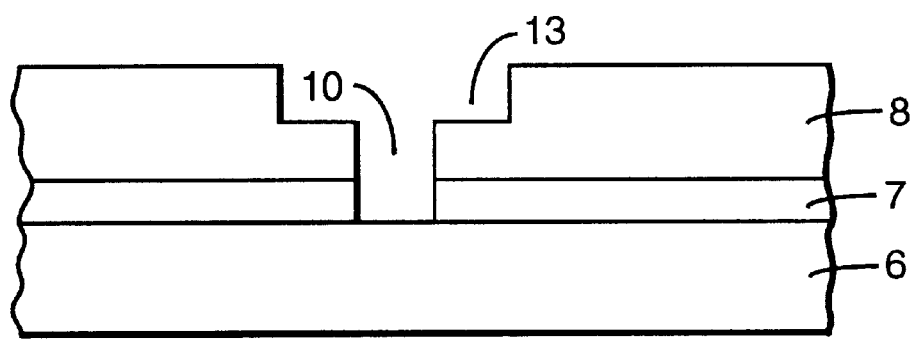
Figure 8:
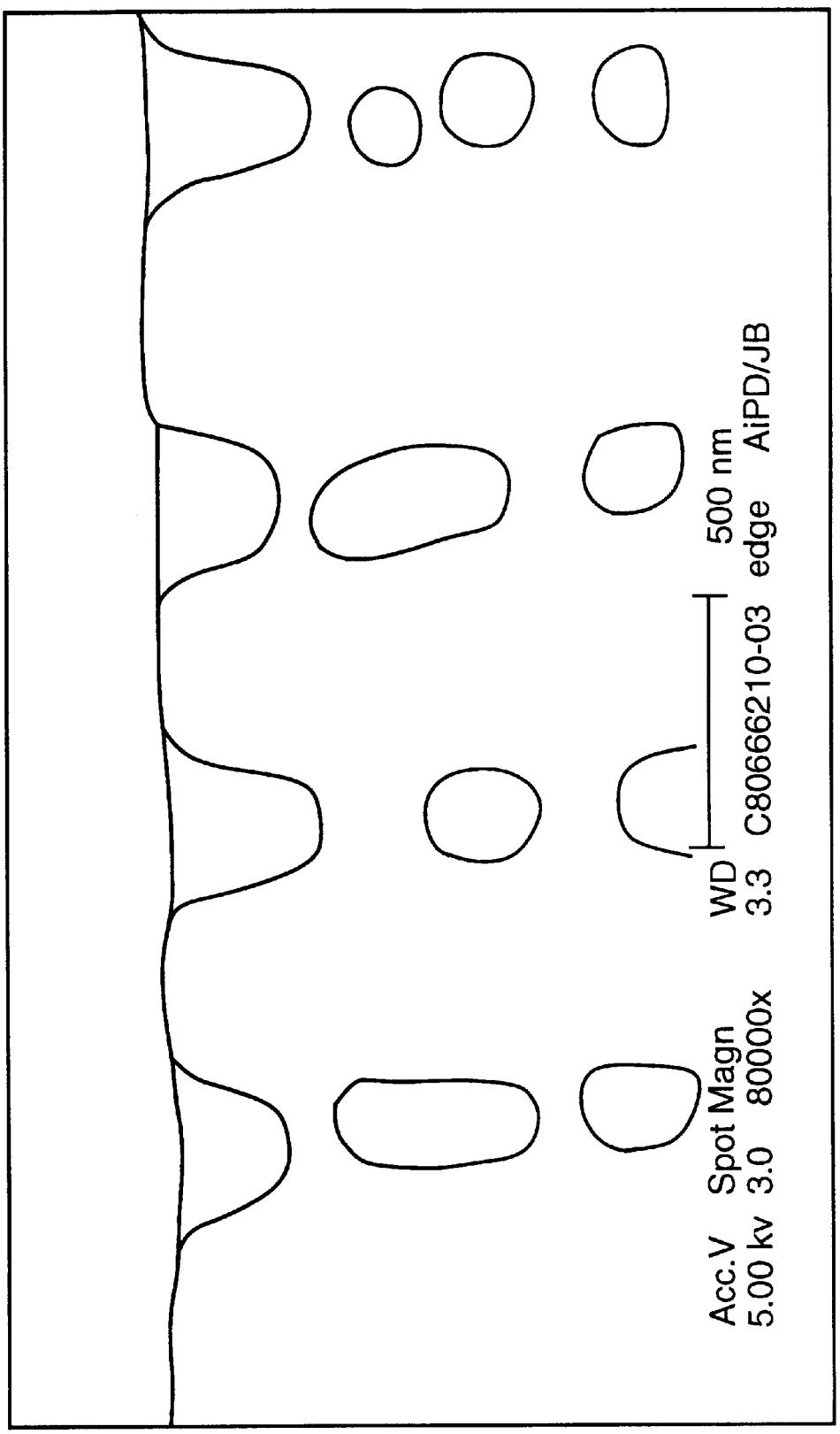
FIG. 8 is a scanning electron micrograph (SEM) photo showing voids in BARC filled vias.
Figure 9:
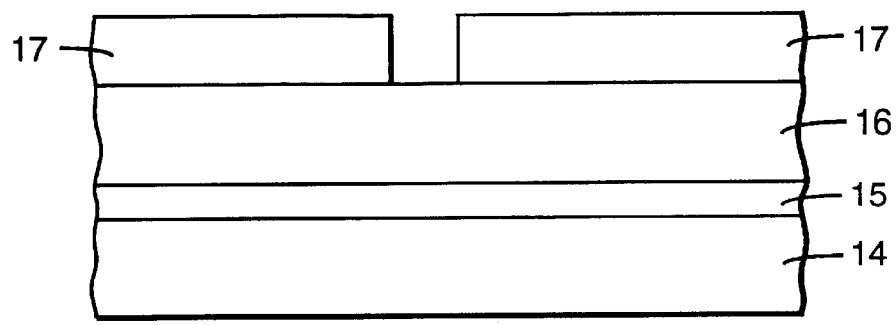
FIGS. 9–11 show cross-sections of a semiconductor structure in various stages of fabrication using a dual-damascene process according to the present invention.

A dual-damascene process according to the present invention is now described. As shown in FIG. 9, 100 nm of polysilicon, layer 15, is deposited on top of metal layer 14 using conventional deposition techniques. Layer 14 is copper but can also be copper alloys, tungsten, aluminum, or any suitable interconnect material. Layer 15 is a protection layer which primary function is to protect metal layer 14 during the patterning and etching of oxide layer 16 to form the via and damascene trench. Thus, the selectivity between subsequently formed oxide layer 16 and layer 15 should be high (e.g. 5 to 1) to allow use of layer 15 as an etch stop during etching of oxide layer 16.

Layer 16, a 1000 nm layer of TEOS, is deposited on top of polysilicon layer 15. Layer 16 can be a low k (i.e. k<4) dielectric or doped TEOS. Further, layer 16 can be formed using deposition or spin-coating. Resist 17 is patterned on oxide layer 16 to define a hole or via 18.

Figure 10:
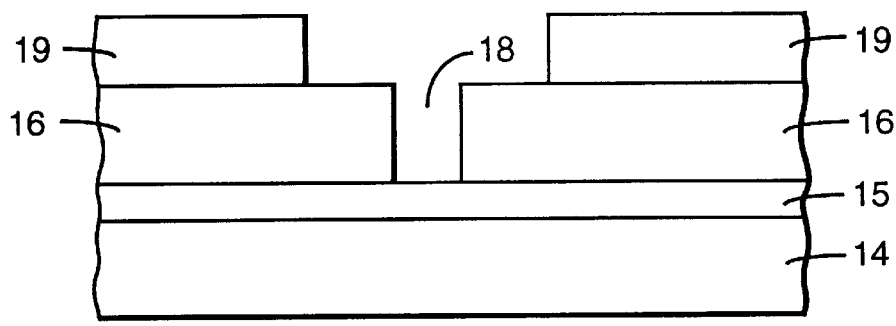

FIG. 10 depicts the structure of FIG. 9 after via 18 is formed by etching oxide layer 16 using resist 17 as a mask, removing resist 17, and then patterning resist 19 on top of oxide layer 16 to define damascene trench 20. Polysilicon layer 15 functions as an etch stop for the via etch. Since layer 15 is polysilicon and layer 16 is TEOS in this particular embodiment of the invention, a suitable etchant chemistry for etching oxide layer 16 is the gas mixture including $C_4F_8/CO/Ar$.

Figure 11:
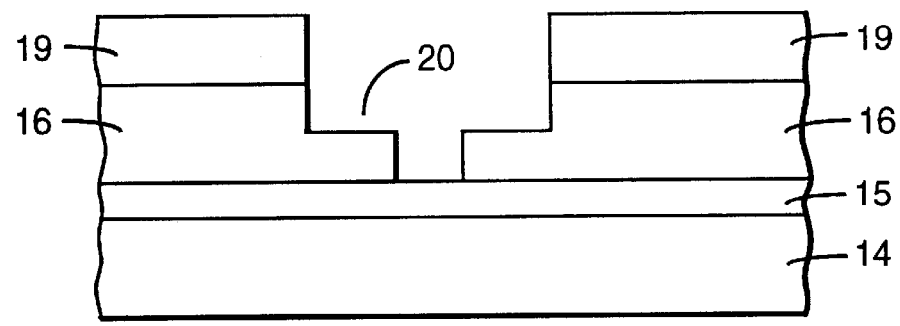

To form damascene trench 20 shown in FIG. 11, 500 nm of oxide layer 16 is time-etched using resist 19 as a mask. Because the selectivity between oxide layer 16 and polysilicon layer 15 is high, layer 15 protects layer 14 during the formation of trench 20.

Figure 12:
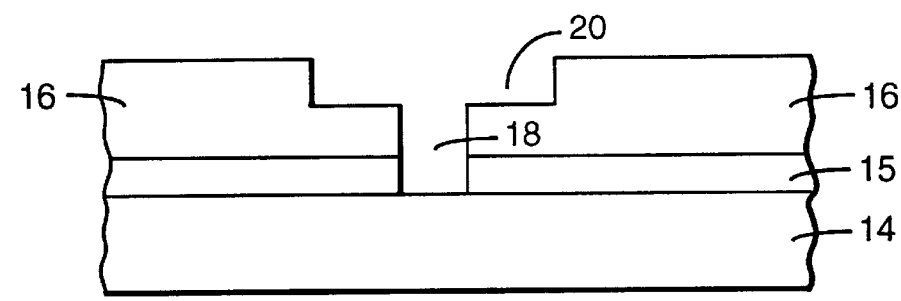
FIG. 12 shows a damascene structure fabricated using a dual-damascene process according to the present invention.

A damascene structure according to the present invention is shown in FIG. 12. FIG. 12 depicts the structure of FIG. 11 after resist 19 is removed and an area of polysilicon layer 15 defined by via 18 is etched using the gas mixture including $HBr/Cl_2/He/O_2$ to expose metal layer 14 through via 18. Trench 20 and via 18 are then filled with a conductive material. Excess conductive material are removed using CMP or an etch back step.

Figure 13:
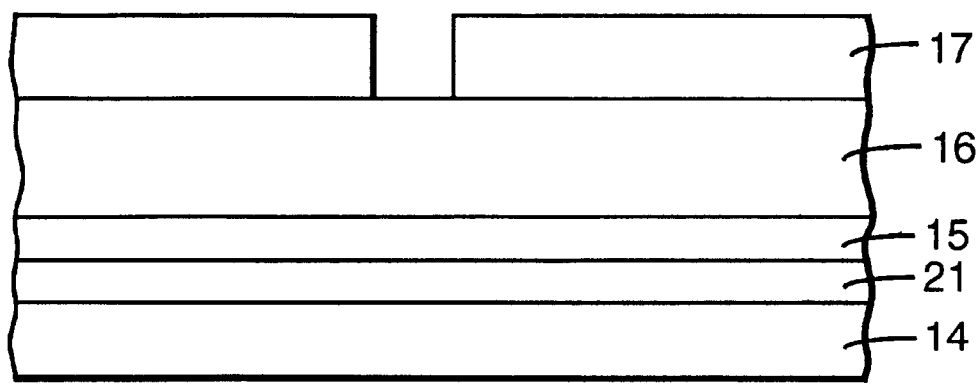
FIGS. 13–16 show cross-sections of a semiconductor structure in various stages of fabrication using an embodiment of the invention wherein a metal sealant layer is employed.

In applications where a layer of SiN is required to seal the underlying metal layer 14, the present invention can be practiced as shown in FIG. 13. A 50 nm layer of SiN, layer 21, is deposited on top of metal layer 14. As in the embodiment described above, 100 nm of polysilicon layer 15, 1000 nm of oxide layer 16, and resist 17 are provided in sequence, as shown in FIG. 13.

Figure 14:
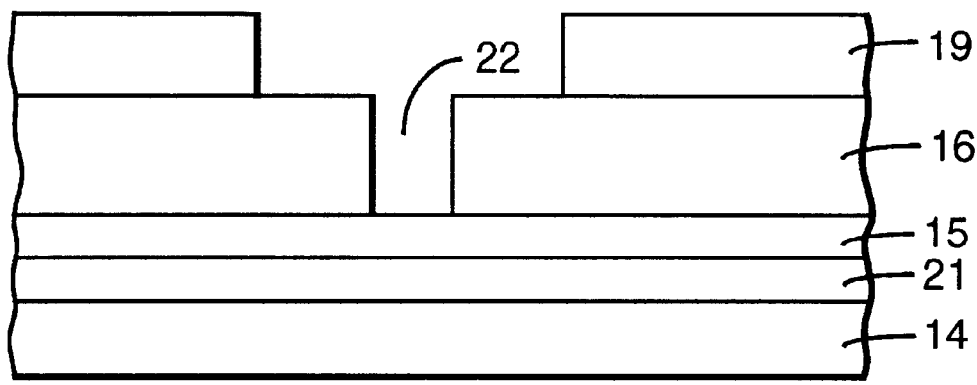

FIG. 14 depicts the structure of FIG. 13 after via 22 is formed by etching oxide layer 16 using resist 17 as a mask and stopping on polysilicon layer 15. After removal of resist 17, resist 19 is patterned on top of oxide layer 16 to define damascene trench 23.

Figure 15:
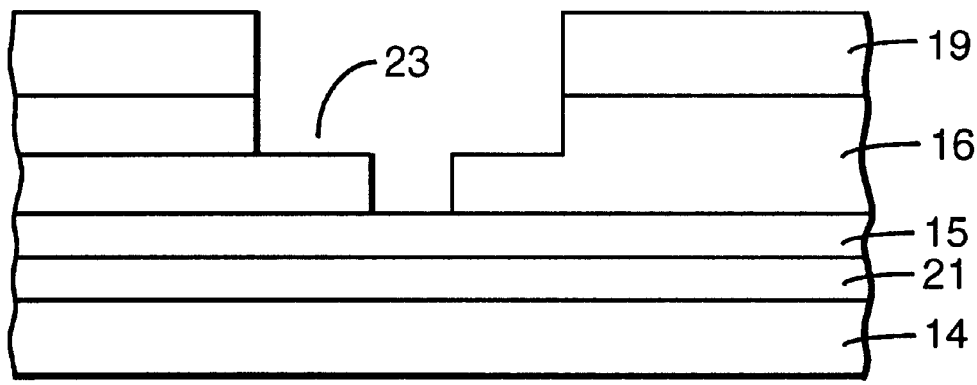
Figure 16:
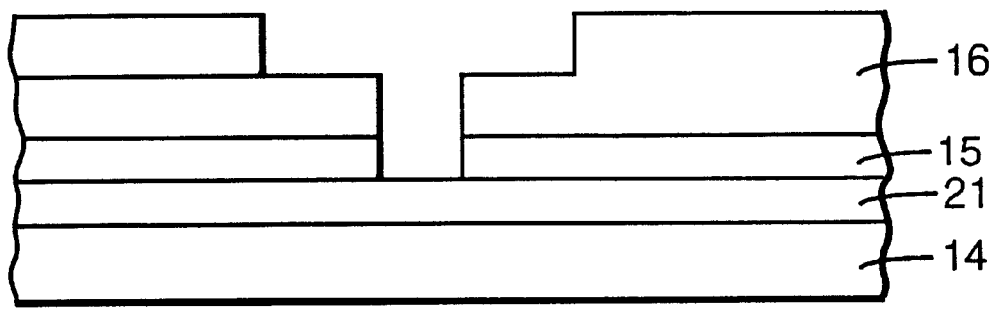

FIG. 15 depicts the structure of FIG. 14 after 500 nm of oxide layer 16 is time-etched to form damascene trench 23. FIG. 16 shows the structure of FIG. 15 after polysilicon layer 15 is etched.

Figure 17:
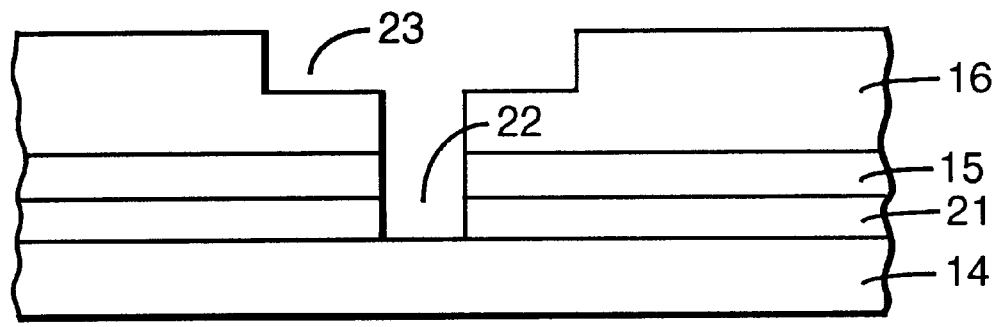
FIG. 17 shows a damascene structure fabricated using an embodiment of the present invention wherein a metal sealant layer is employed.

FIG. 17 shows a damascene structure fabricated according to an embodiment of the present invention. FIG. 17 depicts the structure of FIG. 16 after SiN layer 21 is etched using the etchant gas mixture including $CHF_3/N_2$. As before, the damascene structure is subsequently filled with conductive material and then planarized.

Figure 18:
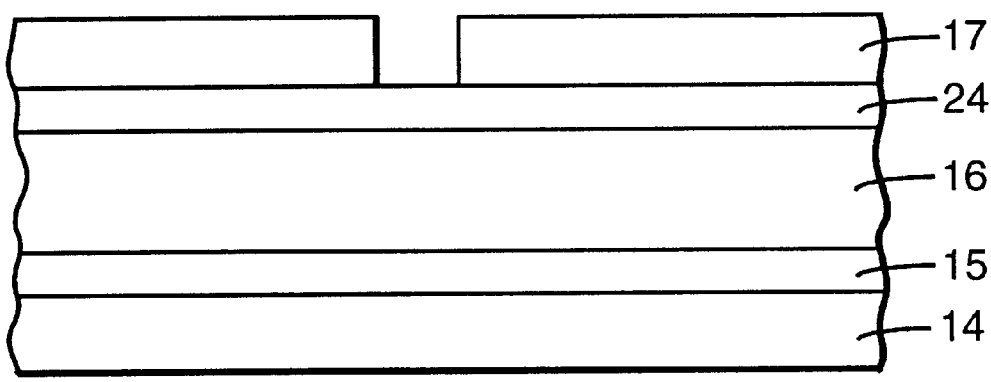
FIG. 18 shows a cross-section of a semiconductor structure wherein an anti-reflective coating is used according to the present invention.

FIG. 18 shows another embodiment of the present invention wherein anti-reflective coating (ARC) 24, such as silicon oxynitride (SiON), is deposited on top of oxide layer 16 and underneath resist 17. Using the gas mixture including $CF_4/He/O_2$, the portion of ARC 24 exposed through resist 17 is etched before etching oxide layer 16 to form the via. The damascene trench is subsequently formed by removing resist 17, patterning a layer of resist on top of ARC 24 to define the trench, etching ARC 24, and then etching oxide 16. The remaining resist and ARC 24 are removed prior to etching the polysilicon layer 15 to expose the underlying metal layer 14 through the via.

The above detailed description is provided to illustrate the specific embodiments of the present invention and is not intended to be limiting. It is to be understood that numerous variations and modifications within the scope of the present innovation are possible. For example, one skilled in the art using the teachings of the invention can transpose the order of the disclosed processing steps, interpose insignificant steps, or substitute equivalent materials therefor. The present invention is set forth in the following claims.

What is claimed is:

1. A damascene structure comprising:
    a metal layer;
    a sealant layer;
    a protection layer directly on top of said sealant layer;
    an oxide layer directly on top of said protection layer, said oxide layer to said protection layer selectivity is at least 5 to 1;
    a via formed in said oxide layer and through said sealant layer and said protection layer; and,
    a damascene trench in communication with said metal layer through said via.

2. The damascene structure of claim 1 wherein said metal layer is a material selected from the group consisting of copper, copper alloy, aluminum, and tungsten.

3. The damascene structure of claim 1 wherein said sealant layer is silicon nitride.

4. The damascene structure of claim 1 wherein said protection layer is polysilicon.

5. The damascene structure of claim 1 wherein said oxide layer is a material selected from the group consisting of TEOS, doped TEOS, and low-k dielectric.

6. The damascene structure of claim 1 wherein said metal layer is copper, said sealant layer is silicon nitride, said protection layer is polysilicon, and said oxide layer is TEOS.

* * * * *